(12) United States Patent
Hsia et al.

(10) Patent No.: US 8,409,965 B2
(45) Date of Patent: Apr. 2, 2013

(54) METHOD AND STRUCTURE FOR LED WITH NANO-PATTERNED SUBSTRATE

(75) Inventors: Hsing-Kuo Hsia, Jhubei (TW); Ching-Hua Chiu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 99 days.

(21) Appl. No.: 13/094,344

(22) Filed: Apr. 26, 2011

(65) Prior Publication Data
US 2012/0273749 A1 Nov. 1, 2012

(51) Int. Cl.
*H01L 21/30* (2006.01)

(52) U.S. Cl. ............................ 438/458; 438/457; 257/13

(58) Field of Classification Search .................... 257/13; 438/457, 458
See application file for complete search history.

(56) References Cited

U.S. PATENT DOCUMENTS

2010/0090312 A1* 4/2010 Guo et al. ..................... 257/615

* cited by examiner

*Primary Examiner* — Tan N Tran
(74) *Attorney, Agent, or Firm* — Haynes and Boone, LLP

(57) ABSTRACT

The present disclosure provides one embodiment of a method for fabricating light-emitting diode (LED) devices. The method includes forming a nano-mask layer on a first substrate, wherein the nano-mask layer has a randomly arranged grain pattern; growing a first epitaxy semiconductor layer in the first substrate, forming a nano-composite layer; growing a number of epitaxy semiconductor layers over the nano-composite layer; bonding a second substrate to the epitaxy semiconductor layers from a first side of the epitaxy semiconductor layers; applying a radiation energy to the nano-composite layer; and separating the first substrate from the epitaxy semiconductor layers from a second side of the epitaxy semiconductor layers.

20 Claims, 6 Drawing Sheets

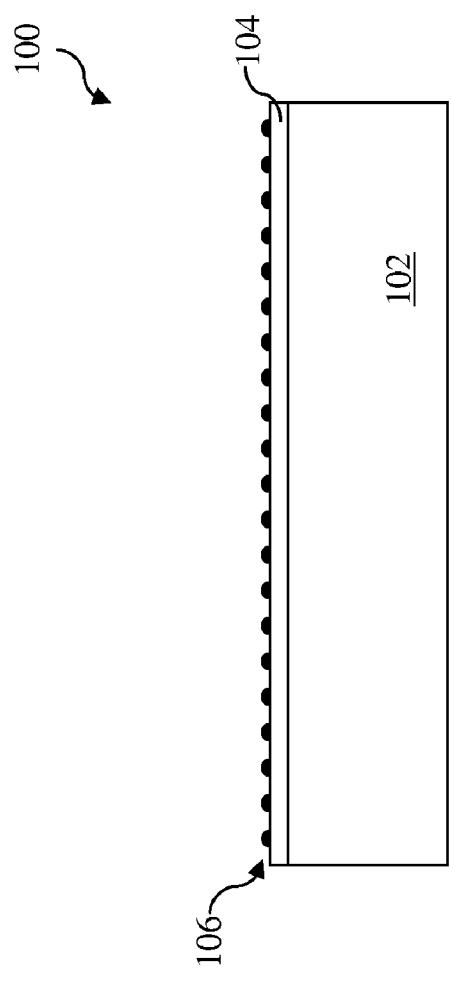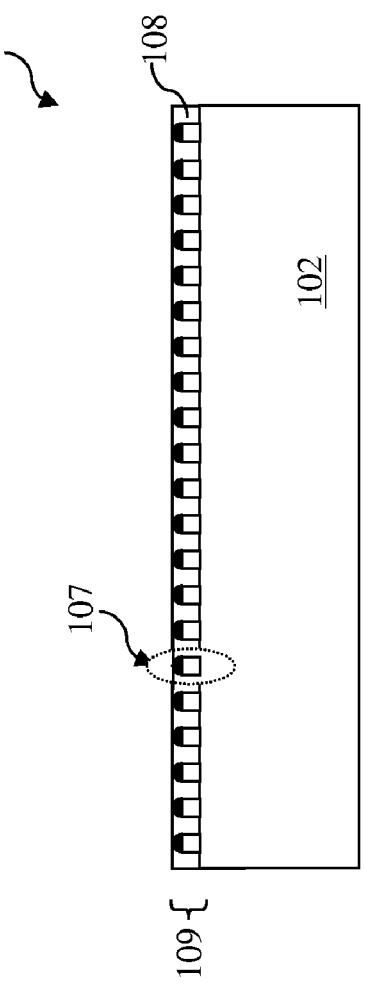

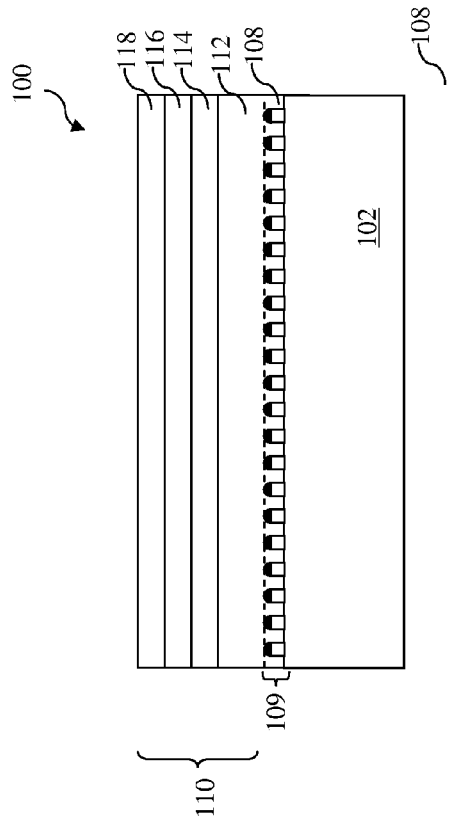
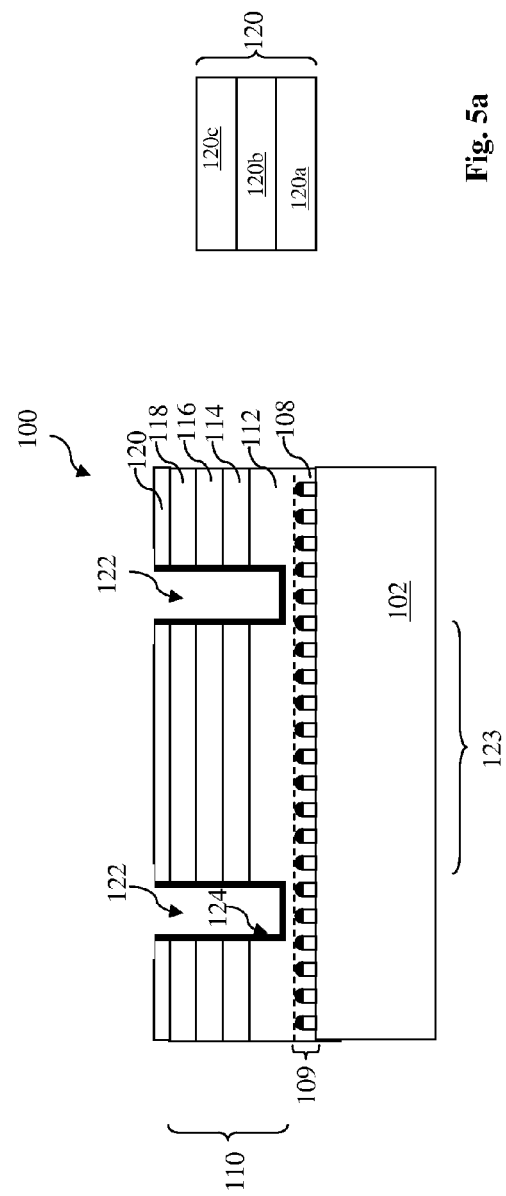

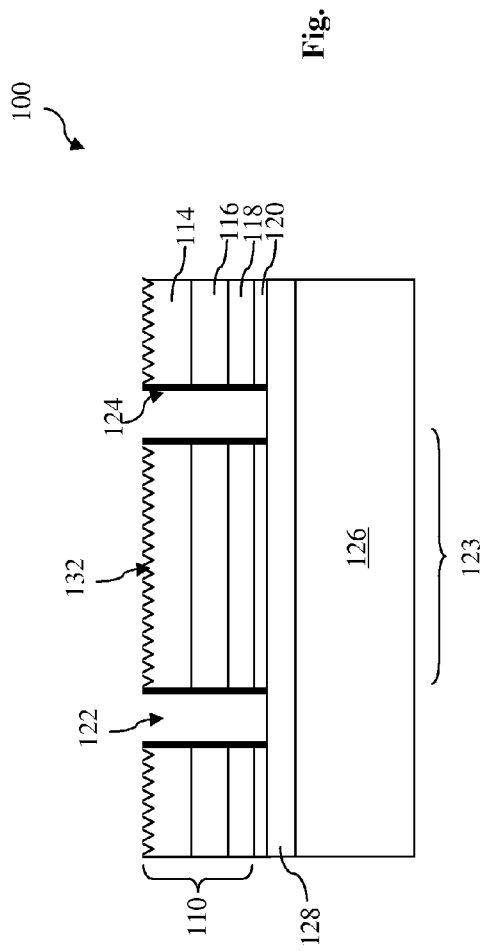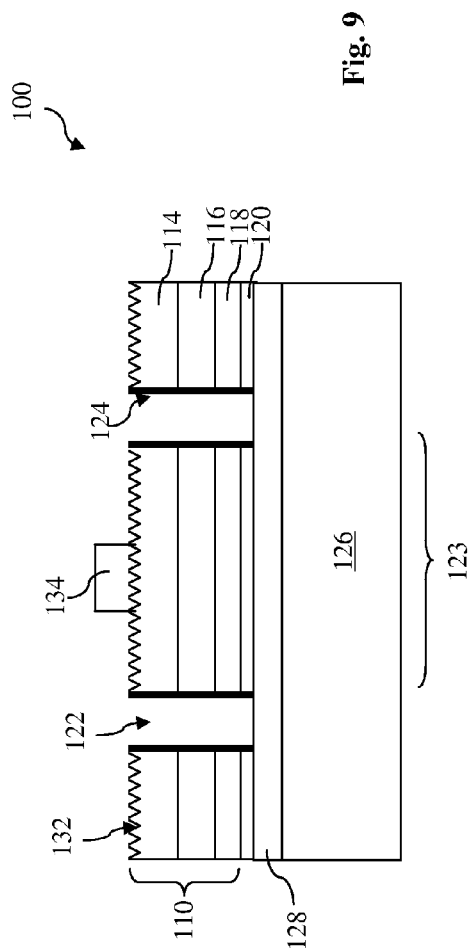

METHOD AND STRUCTURE FOR LED WITH NANO-PATTERNED SUBSTRATE

BACKGROUND

For a gallium nitride (GaN) based light-emitting diode (LED), a sapphire substrate is widely used. The sapphire substrate has poor thermal performance and electrical isolation. To improve the thermal and electrical properties of the GaN-LED, another substrate with higher thermal conductivity and electrical conductivity is bonded to the LED structure and then the sapphire substrate is removed. However, the removal of the sapphire substrate is a challenge since it may cause cracking of the LED structure and further lead to leakage current and device degradation. Therefore, methods and structures of GaN-LED devices are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2 through 9 are sectional views of a LED structure at various fabrication stages according to one or more embodiments;

FIG. 5a is a sectional view of the metal layer in the LED structure of FIG. 5.

DETAILED DESCRIPTION

Figure 1:
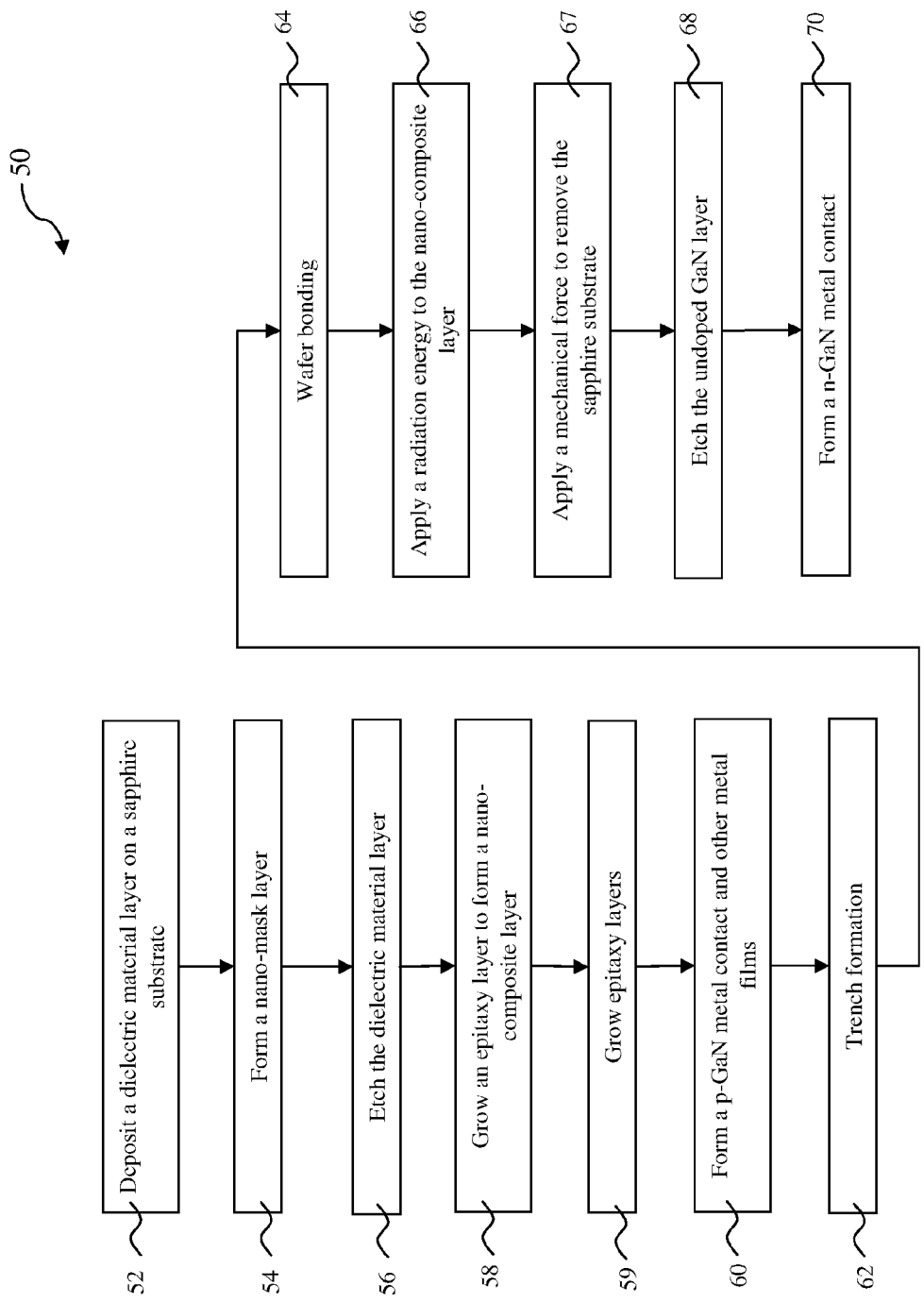
FIG. 1 is a flowchart of a method for making a light-emitting diode (LED) structure according to one or more embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a flowchart 50 of a method for making a light-emitting diode (LED) structure according to one or more embodiments. FIGS. 2 through 9 are sectional views of a LED structure 100 at various fabrication stages. With reference to FIGS. 1 through 9, the LED structure 100 and the method 50 of making the same are collectively described.

Referring to FIGS. 1 and 2, the method 50 begins at step 52 by providing a sapphire substrate 102 and forming a dielectric material layer 104 on the sapphire substrate 102. The dielectric material layer 104 includes silicon oxide. The dielectric material layer 104 may be deposited on the sapphire substrate 102 by chemical vapor deposition (CVD). For example, the silicon oxide is formed by CVD using a precursor including silane ($SiH_4$) and oxygen ($O_2$). In other examples, the precursor to form silicon oxide may include hexachlorodisilane (HCD or $Si_2Cl_6$), dichlorosilane (DCS or $SiH_2Cl_2$), bis(tertiarybutylamino)silane (BTBAS or $C_8H_{22}N_2Si$), or disilane (DS or $Si_2H_6$). Other dielectric material may be used for the dielectric material layer 104 if it can withstand thermal treatment with a high temperature, such as about 1000° C. In other embodiments, the dielectric material layer 104 alternatively includes silicon nitride, silicon oxynitride, or silicon carbide. In one embodiment, the dielectric material layer 104 has a thickness ranging between about 100 nm and about 400 nm.

Still referring to FIGS. 1 and 2, the method proceeds to step 54 by forming a nano-mask layer 106. The nano-mask layer 106 includes nano-sized grains spaced away from each other and randomly distributed on the dielectric material layer 104. In one embodiment, the nano-sized grains in the nano-mask layer 106 are substantially round and have diameters distributed between about 100 nm and about 600 nm. In another embodiment, the nano-sized grains have a density ranging from about $10^7$ to about $10^9$ grains/cm². In yet another embodiment, the nano-sized grains are spaced from each other with an average spacing S and an average diameter D wherein the ratio S/D ranges between about 1.1 and about 1.5.

The nano-mask layer 106 includes a material different from the dielectric material layer 104 and having an etching selectivity from the dielectric material layer 104 during a subsequent etching process. Particularly, the subsequent etching process can substantially remove the dielectric material layer 104 while the nano-mask layer substantially remains thereafter.

In one embodiment, the nano-mask layer 106 includes a polymeric material, such as polyimide or poly(methyl methacrylate) (PMMA). In furtherance of the embodiment, the nano-mask layer 106 is formed by a process including a first step of spin-on coating and a second step of baking to remove the solvent. The first step is spin-on coating a polymeric solution dispersed with nano-particles (such as metal particles) to the dielectric material layer 104. The second step is a thermal treatment to remove the solvent and/or to cure the coated polymeric solution. When the solvent is reduced from the coated polymeric solution along the thermal treatment process, the polymeric material aggregates around the randomly distributed nano-particles due to the reduced free energy from various factors, such as the surface tension. The nano-mask layer of the polymeric material has a discontinuous structure with a plurality of randomly distributed grains. Thus, the formed nano-mask layer 106 is a nano-sized composite layer having both the polymeric material and nano-particles.

In another embodiment, the nano-mask layer 106 includes a dielectric material different from that of the dielectric material layer 104 in composition. In various examples, the nano-mask layer 106 includes aluminum oxide, aluminum nitride, or silicon oxide. The nano-mask layer 106 of the dielectric material can be formed by a similar process including a first step of spin-on coating and a second step of baking to remove the solvent. The first step uses spin-on coating to apply the dielectric material in liquid state (or a liquid precursor) dispersed with nano-particles (such as metal particles) to the dielectric material layer 104. The second step is a thermal treatment to remove the solvent. With a mechanism similar to the formation of the nano-mask layer of the polymeric material, the formed nano-mask layer of the dielectric material has a discontinuous structure with a plurality of randomly distributed grains. Thus, the formed nano-mask layer 106 is a nano-sized composite layer having both the dielectric material and nano-particles.

In yet another embodiment, the nano-mask layer 106 includes a metal, such as nickel or silver. In furtherance of the embodiment, the formation of the nano-mask layer 106 includes a deposition and a thermal treatment. In one example, the deposition of the metal uses a physical vapor deposition (PVD) to form a thin metal film. In another example, the thin metal film has a thickness ranging between a few angstroms and about 100 angstroms. The thermal treatment is applied to the thin metal film with a temperature high enough so that the thin metal film is liquidized and is redistributed to nano-sized grains under the surface tension. In one example, the thermal treatment has a duration ranging between about 1 minute and about 10 minutes. The thermal treatment may be implemented in a suitable tool, such as a rapid thermal annealing (RTA) apparatus.

Referring to FIGS. 1 and 3, the method proceeds to step 56 by performing an etching process to the dielectric material layer 104 using the nano-mask layer 106 as an etching mask. The etching process has an adequate etching selectivity and transfers the random pattern of the nano-mask layer 106 to the dielectric material layer 104, resulting in randomly distributed dielectric posts as illustrated in FIG. 3. The etching process is implemented such that the sapphire substrate 102 within the openings of the dielectric material layer 104 are exposed. The etching process is anisotropic and etches substantially vertically. In one embodiment, the etching process includes a plasma etch or particularly a reactive ion etching (RIE). The etching process may use a fluorine-based etchant such as $CF_2$, $CF_3$, or combinations thereof. The dielectric posts of the etched dielectric material layer 104 and the nano-sized grains of the nano-mask layer 106 constitute a plurality of nano-rods 107. Each of the nano-rods 107 includes one of the nano-sized grains and corresponding one of the dielectric post dielectric posts underlying thereof. In the present embodiment, the plurality of nano-rods 107 are randomly distributed in location and size. The plurality of the nano-rods 107 define one or more open regions of the sapphire substrate 102 uncovered by the nano-rods 107.

Referring to FIGS. 1 and 4, the method proceeds to step 57 by growing an epitaxy semiconductor material layer 108 on the sapphire substrate 102 within the open regions uncovered by plurality of the nano-rods 107. The epitaxy semiconductor material layer 108 fills in the open regions of the sapphire substrate 102, resulting a nano-composite layer 109. The nano-composite layer 109 is a material layer having a nano-sized structure and further includes the epitaxy semiconductor material and the dielectric material. The epitaxy semiconductor material layer 108 includes a semiconductor material and is deposited by epitaxy growth. In one embodiment, the epitaxy semiconductor material layer 108 includes gallium nitride (GaN). In furtherance of the present embodiment, the epitaxy semiconductor material layer 108 includes undoped GaN.

Referring to FIGS. 1 and 4, the method proceeds to step 58 by growing various epitaxy layers 110. The epitaxy layers 110 are designed to form one or more light-emitting diodes (LEDs). In one embodiment, the expitaxy layers include a n-typed doped semiconductor layer and a p-type doped semiconductor layer configured to emit spontaneous radiation. In another embodiment, the epitaxy layers 110 further include a single quantum well (SQW) structure disposed between the n-type doped semiconductor layer and the p-type doped semiconductor layer. A SQW includes two different semiconductors and can be used to tune the wavelength of the LED device. Alternatively, a multiple quantum well (MQW) structure is interposed between the n-type doped semiconductor layer and the p-type doped semiconductor layer. The MQW structure includes a plurality of SQWs in a stack. The MQW structure preserves the advantages of a SQW structure and has a larger volume of the active region allowing for high light powers.

In one embodiment, the epitaxy layers 110 are GaN based semiconductor materials. In various examples, those GaN based LEDs emit blue light, ultra-violet (UV) light, or both. Described below is a particular embodiment of the epitaxy layers 110 having GaN-based semiconductor materials.

The epitaxy layers 110 include a buffer layer 112 epi-grown on the nano-composite layer 102. In one example, the buffer layer 112 includes un-doped GaN, so it may also be referred to as GaN layer 112. In furtherance of the example, the buffer layer 112 has a thickness ranging between about 1 micron and about 4 micron. In another embodiment, the epitaxy semiconductor material layer 108 and the buffer layer 112 include the same material (such as undoped GaN) and are sequentially formed by a same epitaxy growth process. For example, the epitaxy growth process first deposits the epitaxy semiconductor material layer 108 and continues to form the buffer layer 112.

The epitaxy layers 110 include an n-type doped GaN layer (n-GaN layer) 114 epi-grown on the buffer layer 112. The n-GaN layer 114 includes a gallium nitride semiconductor layer doped by n-type dopant, such as silicon or oxygen. In one example, the n-GaN layer 114 has a thickness ranging between about 1 micron and about 4 micron.

The epitaxy layers 110 include a MQW structure 116 formed on the n-GaN layer 114 by various epitaxy growths. The MQW structure 116 includes a plurality of pairs of semiconductor films. In one example, the MQW structure 116 includes from about 5 to about 15 pairs of the semiconductor films. In another example, the MQW structure 116 has a thickness ranging between 1 nm and about 4 nm. In one embodiment, each pair of semiconductor films includes an indium gallium nitride film and a gallium nitride film (InGaN/GaN). In one example, the InGaN/GaN films are doped with n-type dopant. In another embodiment, each pair of semiconductor films includes an aluminum gallium nitride film and a gallium nitride film (AlGaN/GaN). In one example, the AlGaN/GaN films are doped with n-type dopant.

The epitaxy layers 110 include a p-type doped GaN layer (p-GaN layer) 118 epi-grown on the MQW structure 116. In one embodiment, the p-GaN layer 118 includes a gallium nitride semiconductor layer doped by p-type dopant, such as magnesium, calcium, zinc beryllium, carbon, or combinations thereof. In one example, the p-GaN layer 118 has a thickness ranging between about 1 micron and about 4 micron.

Various materials in the epitaxy semiconductor material layer 108 and the epitaxy layers 110 can be epitaxy grown by a suitable technique, such as metal organic chemical vapor deposition (MOCVD, metalorganic vapor phase epitaxy or MOVPE). In one example, a GaN layer (such as the epitaxy semiconductor material layer 108, the buffer layer 112, the n-GaN layer 114, the p-GaN layer 118, or GaN film in the MQW structure 116) can be epitaxy grown using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical.

In another example, the AlGaN film in the MQW structure 116 can be epitaxy grown by MOVPE using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical.

Alternatively, the various epitaxy layers (108 and 110) can be epitaxy grown by other suitable technique, such as hydride vapor phase epitaxy (HVPE) or molecular beam epitaxy (MBE). In one example, a GaN layer (such as the epitaxy semiconductor material layer 108 and the buffer layer 112) can be epitaxy grown by HVPE with source materials including gallium chloride and ammonia gases.

Referring to FIGS. 1 and 5, the method 50 proceeds to step 60 by forming a metal layer 120. In one embodiment, the metal layer 120 may include multiple metal films serving various functions. FIG. 5a illustrates one embodiment of the metal layer 120 in a sectional view. In FIG. 5a, the metal layer 120 includes a first metal film 120a as a contact to electrically connect the p-GaN layer 118. Therefore, the first metal film 120a is also referred to as p-GaN contact (or p-metal) 120a. In one example, the p-metal 120a has a thickness ranging between about 4 angstroms and about 10 angstroms. In another example, the p-metal 120a includes a transparent conductive film, such as indium tin oxide (ITO), formed on the p-GaN layer 118. In other examples, the p-metal 120a includes nickel (Ni), chromium (Cr), or other suitable metal.

As illustrated in FIG. 5a, the metal layer 120 further includes a second metal film (or reflector) 120b disposed on the p-metal 120a. The reflector 120b has a high reflectivity to the LED emitted light to increase the emission efficiency of the corresponding LED devices. In one example, the reflector 120b has a thickness ranging between about 1000 angstroms and about 2000 angstroms. In another example, the reflector 120b includes silver, aluminum, or other suitable metal.

As illustrated in FIG. 5a, the metal layer 120 further includes a third metal film (or bonding metal) 120c disposed on the reflector 120b and designed for wafer bonding. In one example, the bonding metal 120c includes gold (Au), gold tin (AuSn), gold indium (AuIn), or other suitable metal to achieve eutectic bonding or other wafer bonding mechanism. In another example, the bonding metal 120c has a thickness ranging between about 1 micron and about 2 micron. In one or more embodiments, the various metal films can be formed by physical vapor deposition (PVD) or other suitable technique.

Referring to FIGS. 1 and 5, the method 50 proceeds to step 62 by forming various trenches 122 that define various chips (or dies) 123. Each of the chips 123 includes a single LED or a plurality of LEDs configured in an array. The trenches 122 are designed to surround each of the chips 123 and separate the chips from each other. At a later step when the chips 123 are separated by a sawing process, the sawing process is applied to cut the LED structure 100 through the trenches 123. In one embodiment, the trenches 122 include a width relating to the width of the saw used in the sawing process. For example, the trenches 122 may have a width about 30 micron or more. In the present embodiment, the trenches 122 are formed through various material layers including the n-GaN layer 114, the MQW structure 116, and the p-GaN layer 118, and are further extended into the buffer layer 112.

In one embodiment, the trenches 122 can be formed by a procedure including a lithography patterning process and an etching process. For example, a patterned photoresist layer is formed on the metal layer 120 by the lithography process. The patterned photoresist layer includes various openings that define the trenches 122. As an example, the lithography process includes spin-on coating, baking, exposure, post exposure baking (PEB), and developing. The etching process is then applied to etch the various material layers using the patterned photoresist layer as an etching mask. The etching process may includes dry etch, wet etch, or combinations thereof. The etching process may include various etching steps, each being designed with a particular etchant to effectively remove one or more respective material layers. The patterned photoresist layer is removed thereafter by wet stripping or plasma ashing. In an alternative embodiment, the formation of the trenches 122 may further employ a hard mask by a procedure that includes forming the hard mask, patterning the hard mask using a lithography process, and etching the various material layers to form the trenches using the patterned hard mask as an etch mask. The hard mask may be removed thereafter. In another embodiment, the metal layer 120 may be used as a hard mask and is not removed after the etching to form the trenches.

A passivation layer 124 is formed on the sidewalls of the trenches 122 to seal and protect the chips 123. The passivation layer 124 may be further formed on the bottom surface of the trenches 122 as well. The passivation layer 124 includes a dielectric material, such as silicon oxide, silicon nitride, silicon oxynitride, silicon carbide, or other suitable dielectric material. The passivation layer 124 has a film thick enough to protect the chips 123. Alternatively, the passivation layer 124 substantially fills in the trenches 122. In another example, the trenches 122 are filled with more than one dielectric material film. In yet another example, the passivation layer 124 is formed on the sidewalls and bottom surface of the trenches 122 and a polymeric material is further filled in the trenches 122.

Figure 6:
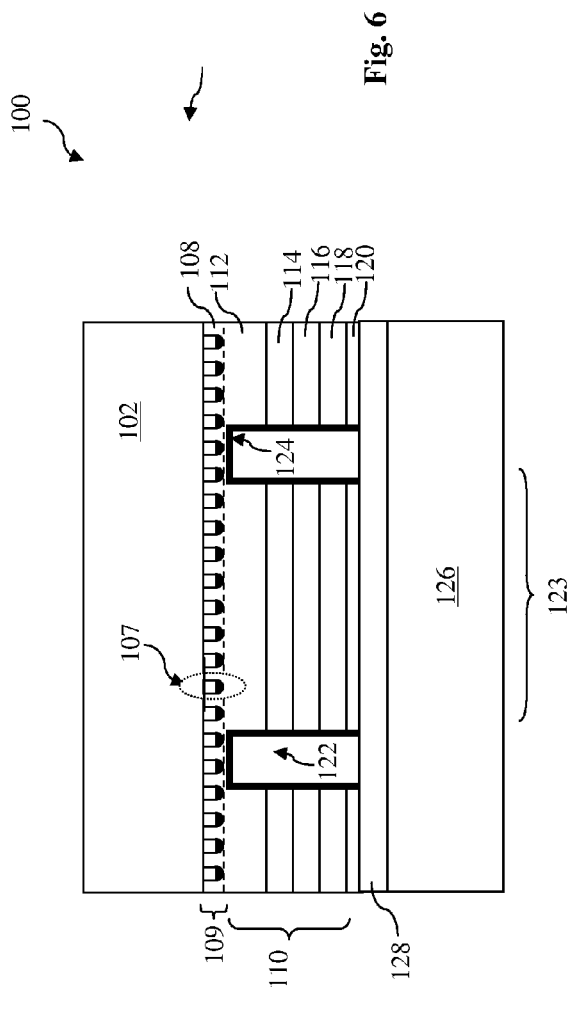

Referring to FIGS. 1 and 6, the method 50 proceeds to step 64 by performing a wafer bonding process to the LED device 100. During the wafer bonding process, a second substrate 126 is bonded to the LED structure 100 through the metal layer 120, specifically through the bonding metal 120c. In one embodiment, the second substrate 126 is a silicon wafer. In another embodiment, the second substrate 126 includes a metal plate or other suitable material with proper material characteristics including mechanical strength to secure the LED structure 100 thereon. The second substrate 126 further includes another bonding metal film 128 disposed on the second substrate 126 by PVD or other suitable technique. In various embodiments, the bonding metal film 128 includes Au, AuSn, AuIn, or other suitable bonding metal. The bonding metal film 128 can be the same to or different from the bonding metal 120c in composition, depending on the wafer bonding mechanism and specifications. For example, the bonding metal 120c and the bonding metal film 128 are paired to achieve eutectic wafer bonding. In one example, the wafer bonding process includes implementing thermal annealing and applying a mechanical pressure during the thermal annealing to increase the bonding strength. Note that FIG. 6 is illustrated upside down from FIG. 5.

Figure 7:
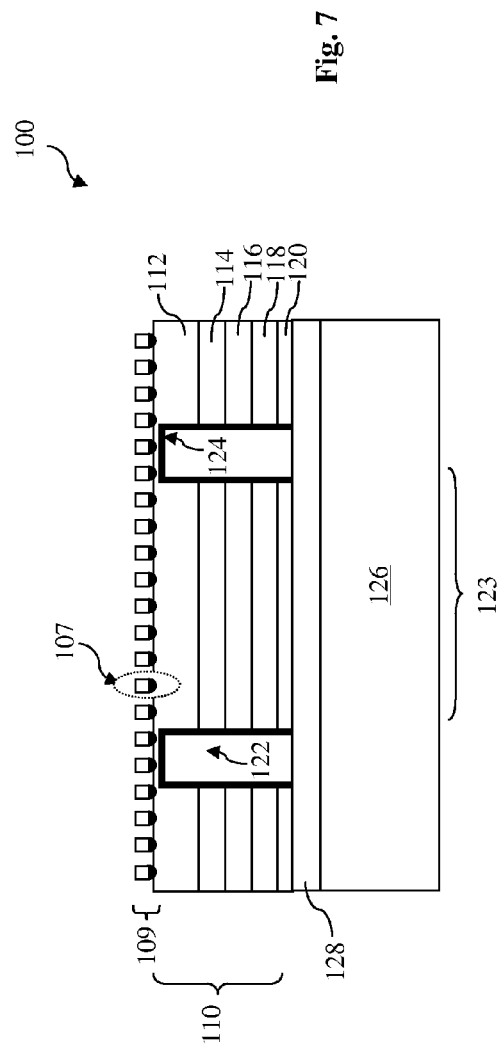

Referring to FIGS. 1 and 7, the method 50 proceeds to step 66 by applying a radiation energy to the nano-composite layer 109. In one embodiment, the radiation energy includes laser beam from a laser source. As described above, the nano-composite layer 109 includes the nano-rods 107 and the epitaxy semiconductor material layer 108. The radiation energy is chosen relative to the epitaxy semiconductor material layer 108 such that the epitaxy semiconductor material layer 108 substantially absorbs the radiation energy. The radiation energy is great enough to decompose the epitaxy semiconductor material layer 208 in the nano-composite layer 109. In the present embodiment, the epitaxy semiconductor material layer 108 includes GaN. When the radiation energy is applied to the nano-composite layer 109, the GaN material in the epitaxy semiconductor material layer 108 is decomposed into gallium and nitrogen. In one embodiment, the radiation energy includes electromagnetic energy from a laser source, also referred to as laser light. In one example, the laser source includes a solid state laser source having a wavelength less than 200 nm. In another example, the laser source includes a krypton fluorine (KrF) excimer laser. In yet another example, the light energy from the laser source is applied to the nano-composite layer 109 in an exposure mode. In the exposure mode, the light energy is simultaneously applied to one field by one shot. One field may include one chip or alternatively includes a plurality of chips. One shot may include one pulse of the laser source (referred to as one shot) as an example.

When the radiation light is applied to the nano-composite layer 109, it may cause cracks to the LED chips 123 at the boundary area of each laser shot due to significantly accumulated stress. The cracks could lead to current leakage of the LEDs and deterioration of the device performance. The disclosed method and the nano-structure of the nano-composite layer 109 addresses these issues. In the present embodiment of the method 50, by implementing the nano-composite layer 109 having a random nano-pattern, the epitaxy semiconductor material layer 108 is directly grown on the sapphire substrate 102 with a reduced grown area. The mechanical stress between the GaN layer 112 and the sapphire substrate 102 is reduced accordingly. The cracking issue is minimized as well. Furthermore, the dielectric material layer 104 substantially does not absorb the laser energy. Therefore, the laser power necessary to decompose GaN in the epitaxy semiconductor material layer 108 is also reduced.

Referring to FIGS. 1 and 7, the method 50 proceeds to step 67 for separating the sapphire substrate 102 from the LED structure 100. Particularly, an external mechanical force is applied to break the nano-rods 107 or break the adhesion between the nano-rods 107 and the sapphire substrate 102. In various embodiments, the step 66 and step 67 are simultaneous, overlapping, or sequential in various embodiments. In one example, the step 67 for applying the mechanical force is implemented after the step 66 for applying the radiation energy. In another example, applying the mechanical force of step 67 and applying the radiation energy of step 66 are simultaneously implemented. In yet another example, applying the mechanical force at step 67 is initiated during the step 66 for applying the radiation energy.

Referring to FIGS. 1 and 8, the method 50 proceeds to step 68 by performing an etching process to remove the nano-rods 107 as well. The etching process is designed to substantially remove gallium nitride. The nano-rods 107 include the dielectric material layer 104 and the nano-mask layer 106. After the separating the sapphire substrate 102 at step 67, a portion of the nano-rods 107 may be partially removed with the sapphire substrate 102. During the etching process, the dielectric material layer 104 and the nano-mask layer 106 are removed as well but with a different etching rate, such as a less etching rate than that of the gallium nitride. Since the different etching rates among the gallium nitride and the dielectric material layer 104 (and the nano-mask layer 106), an uneven surface profile (or rough surface) is generated. With the etching duration properly controlled, the buffer layer 112 is substantially removed, and the n-GaN layer 114 is exposed with a rough surface 132. The etching process is applied to the surface of the LED structure 100 that is exposed after the removal of the sapphire substrate 102. In one embodiment, the etching process includes a reactive-ion etching (RIE) process using a chlorine-based etchant to effectively remove gallium nitride. In a particular example, the etching process uses an inductively coupled plasma reactive-ion etching (ICP-RIE).

The rough surface 132 can improve light extraction and enhance the performance of the LED device 100. In the present embodiment, the rough surface 132 is generated without using a lithography process to define an etching mask. Furthermore, the rough surface 132 has a random pattern that further improves the light extraction efficiency. In one embodiment, the rough surface 132 of the epitaxy layer 110 has a profile similar to the randomly distributed grain pattern of the nano-mask layer 104. For example, the rough surface 132 of the epitaxy layers 110 includes nano-sized dips (or localized recessing areas) spaced away from each other and randomly distributed. In another example, the nano-sized dips in the epitaxy layers 110 are substantially round and have diameters distributed between about 100 nm and about 600 nm. In another embodiment, the nano-sized dips have a dip density ranging from about $10^7$ pits/cm$^2$ to about $10^9$ pits/cm$^2$. In yet another embodiment, the nano-sized dips are spaced from each other with an average spacing S and an average diameter D wherein the ratio S/D ranges between about 1.1 and about 1.5.

Referring to FIGS. 1 and 9, the method 50 proceeds to step 70 by forming a metal layer (or n-GaN contact or n-metal) 134 on the rough surface of the epitaxy layer 110. The metal layer 134 includes chromium (Cr), gold (Au), titanium (Ti), aluminum (Al), other suitable metals, or combinations thereof. The metal layer 134 is disposed on the epitaxy layer 110 by a suitable process, such as PVD. The thickness of the metal layer 134 may range from about 1 micron to about 4 micron. The metal layer 134 is further patterned to form one or more contact features in each of the chips 123. The metal layer 134 contacts the epitaxy layer 110. Particularly, the metal layer 134 electrically connects the n-GaN layer 114.

Other processing steps may be included before, during or after the method 50. For example, a chip sawing process may be applied to separate various chips 123. Various packaging steps are subsequently implemented to package discrete LED chips for various applications. For example, the packaging steps include attaching a LED chip to a packaging substrate, wiring for electrical connection, applying a phosphor layer around the LED chip for tuning the wavelength of the emitted light from the LED chip, and forming a lens on the LED chip for efficient light emission.

Figure 10:
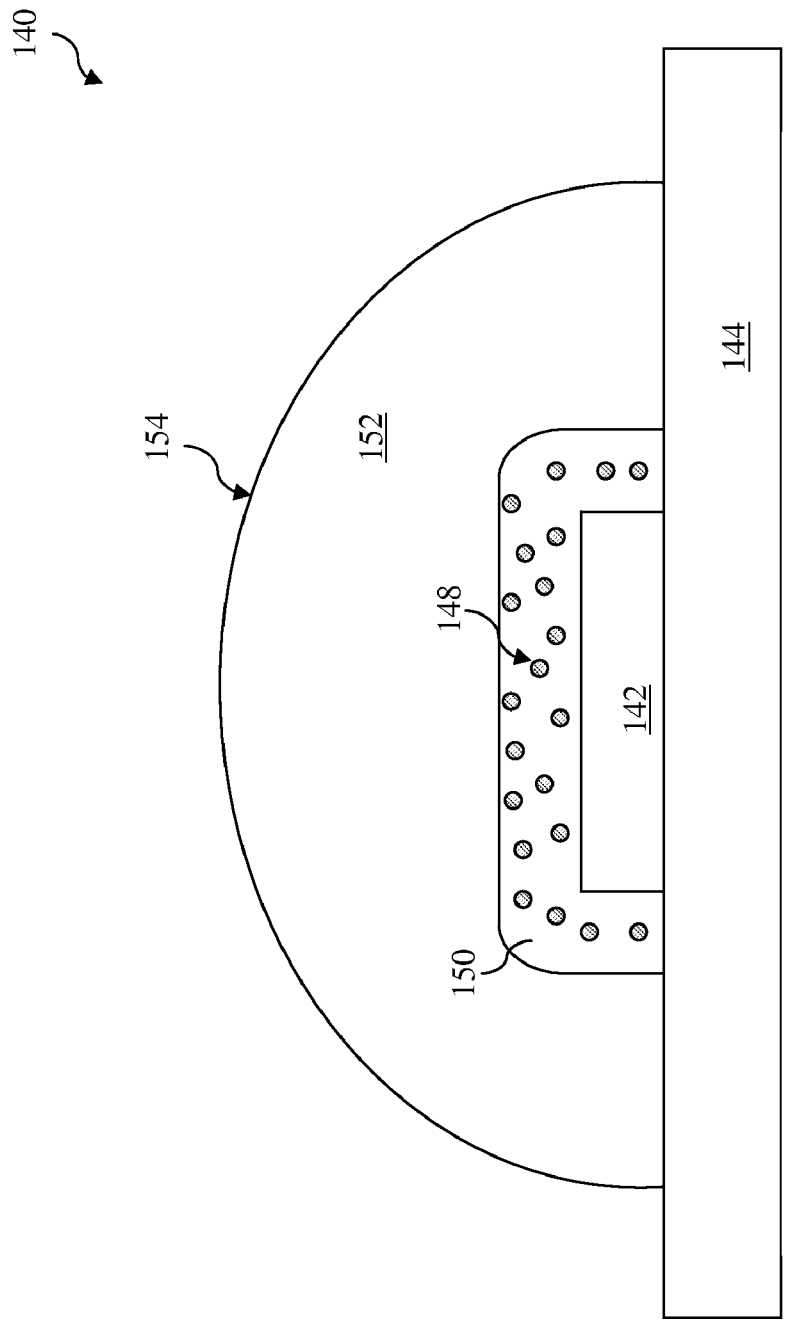
FIG. 10 is a schematic view of a LED device that incorporates a portion of the LED structure of FIG. 9 according to one or more embodiments.

FIG. 10 provides an exemplary LED device 140 packaged with a LED chip 142. The LED chip 142 is a LED chip from the LED structure 100 of FIG. 9. In various examples, the LED chip includes one light emitting diode or a plurality of light emitting diodes configured as an array. The LED chip 142 is attached to a support substrate 144 through an adhesive material, such as silver paste or soldering. In one embodiment, the support substrate 144 includes a silicon wafer or a portion of the silicon wafer. In furtherance of the embodiment, the electrodes of the LED chip 142 are routed to power lines through a proper structure, such as a through-silicon via (TSV). The LED device 140 includes the luminescent material (or phosphor) 148 positioned around the LED chip 142 and designed to shift light emitted from the LED chip 142. The luminescent material 148 is operable to be excited by the LED chip 142 and to emit light having a wavelength greater than that of the light emitted from the LED chip 142. In one example, the luminescent material 148 is dispersed in a transparent material 150, such as silicone or epoxy. The LED device 140 further includes a lens 152 formed on and aligned with the LED chip 142 for emission efficiency. In one embodiment, the lens 152 includes a curved surface 154 in a way to effectively focus the emitted light. The lens 152 includes a transparent material formed on the support substrate 144 and further encapsulates the LED chip 142 and the luminescent material 148 as illustrated in FIG. 10. In one embodiment, the transparent material includes silicone formed by a proper technology, such as molding. The LED device 140 may further include other components, such as other packaging components or driving circuits.

Although various embodiments are provided and explained in the present disclosure. Other alternatives and embodiments may be used without departure from the spirit of the present disclosure. In one embodiment, the substrate 102 may include a material different from sapphire that is to be removed after the formation of the epitaxy layers 110. The nano-mask layer 106 used in the method 50 is still effective to reduce the laser power and the stress during the laser liftoff process to remove the substrate 102. In another embodiment, the nano-mask layer 106 is directly formed on the substrate 102 and is used as the epitaxy growth mask during the formation of the epitaxy layers 110. In this embodiment, the dielectric material layer 104 is eliminated. Accordingly, the nano-mask layer 106 is removed during the etching process after the applying a radiation energy, resulting in a rough surface of the epitaxy layers 110.

In yet another embodiment, the epitaxy layers 110 in the LED structure 100 may be designed differently to form various LED structures or other light emitting structures. The epitaxy layers 110 include n-type doped semiconductor layer 114 and p-type doped semiconductor layer 118 configured to emit spontaneous radiation in ultraviolet regions of the electromagnetic spectrum. In one embodiment, the n-type semiconductor layer 114 includes n-type aluminum gallium nitride (n-AlGaN) with n-type dopant, such as silicon or oxygen, and the p-type semiconductor layer 118 includes p-type aluminum gallium nitride (p-AlGaN) with p-type dopant, such as magnesium. e epitaxy layers 110 may further include a multi-quantum well 116 formed between the n-type doped semiconductor layer 114 and p-type doped semiconductor layer 118. In one embodiment, the multi-quantum well 116 includes gallium nitride/aluminum gallium nitride (GaN—AlGaN) films. Alternatively, the multi-quantum well 116 may include AlInGaN. In another embodiment, the epitaxy layers 110 further include a buffer layer 112, such as a gallium nitride (GaN) buffer layer, formed between the sapphire substrate 110 and the n-type doped semiconductor layer 114. Alternatively, the buffer layer 112 includes aluminum nitride (AlN). The epitaxy layers 110 may further include a super-lattice layer formed between the buffer layer 112 and the n-type doped semiconductor layer 114. In one example, the super-lattice layer includes aluminum nitride/aluminum gallium nitride (AlN/AlGaN) films.

Thus, the present disclosure provides a method for fabricating light-emitting diode (LED) devices. In one embodiment, the method includes forming a nano-mask layer on a first substrate, wherein the nano-mask layer has a randomly arranged grain pattern; growing a first epitaxy semiconductor layer in the first substrate, forming a nano-composite layer; growing a number of epitaxy semiconductor layers over the nano-composite layer; bonding a second substrate to the epitaxy semiconductor layers from a first side of the epitaxy semiconductor layers; applying a radiation energy to the nano-composite layer; and separating the first substrate from the epitaxy semiconductor layers from a second side of the epitaxy semiconductor layers.

In one embodiment of the method, the forming of the nano-mask layer includes forming a material layer on the first substrate; and performing a thermal treatment to the material layer. In another embodiment, the forming of the nano-mask layer includes forming a thin metal film on the first substrate; and annealing the thin metal film such that the thin metal film is liquidized and forms nano-sized grains under surface tension. The thin metal film may include at least one of nickel and silver. In yet another embodiment, the forming of the nano-mask layer includes coating a polymeric solution containing nano-sized particles on the first substrate; and curing the polymeric solution to form the nano-mask layer having the randomly arranged grains on the first substrate. The nano-mask layer may include one of polyimide and poly(methyl methacrylate). In yet another embodiment, the forming of the nano-mask layer includes coating a liquid precursor containing nano-sized particles on the first substrate; and performing a thermal treatment to remove solvent from the liquid precursor and form the nano-mask layer of a dielectric material on the first substrate. The dielectric material may include at least one of aluminum oxide and aluminum nitride. In yet another embodiment, the first substrate includes sapphire and the second substrate includes one of a silicon wafer and a metal plate. In yet another embodiment, the method further includes forming a dielectric material layer on the first substrate and the forming of the nano-mask layer includes forming the nano-mask layer on the dielectric material layer. In yet another embodiment, the method further includes etching the dielectric material layer using the nano-mask layer as an etch mask prior to the growing of the first epitaxy semiconductor layer, forming openings in the dielectric material layer, wherein the growing of the first epitaxy semiconductor layer includes growing the first epitaxy semiconductor layer within the openings of the dielectric material layer. The etching of the dielectric material layer may include implementing a reactive ion etch (RIE) process. In yet another embodiment, the first epitaxy semiconductor layer includes an un-doped gallium nitride (GaN) layer; and the number of epitaxy semiconductor layers include a n-type doped gallium nitride (n-GaN) layer and a p-type doped gallium nitride (p-GaN) layer. In yet another embodiment, the number of epitaxy semiconductor layers further include a multiple quantum well (MQW) structure disposed between the n-GaN layer and the p-GaN layer. The separating of the first substrate from the epitaxy semiconductor layers includes applying a mechanical force to break the nano-composite layer from the first substrate. In yet another embodiment, the method further includes, after the separating the first substrate from the epitaxy semiconductor layers, performing an etching process to the epitaxy semiconductor layers, generating a rough surface of the epitaxy semiconductor layers.

The present disclosure also provides another embodiment of a method. The method includes forming a dielectric material layer on a sapphire substrate; forming a nano-mask layer on the dielectric material layer, wherein the nano-mask layer includes nano-sized grains randomly distributed on the dielectric material layer; performing a first etching process to remove the dielectric material layer uncovered by the nano-mask layer, forming nano-rods each including a dielectric feature from the dielectric material layer and one of the nano-sized grains overlying the dielectric feature; growing a first epitaxy semiconductor layer on the sapphire substrate within gaps of the nano-rods, forming a nano-composite layer having the first epitaxy semiconductor layer and the nano-rods embedded in the first epitaxy semiconductor layer; growing epitaxy semiconductor layers on the nano-composite layer; bonding another substrate to the epitaxy semiconductor layers; applying a radiation energy to the nano-composite layer; applying a mechanical force to the nano-rods to separate the sapphire substrate from the epitaxy semiconductor layers; and performing a second etching process to the epitaxy semiconductor layer, resulting in a rough surface of the epitaxy semiconductor layers.

In one embodiment of the method, the applying of the radiation energy includes applying a laser power to the nano-composite layer. In another embodiment, the forming of the nano-mask layer includes forming a material layer on the dielectric material layer; and performing a thermal treatment to the material layer to form the nano-mask layer. In another embodiment, the nano-sized grains have diameters distributed between about 100 nm and about 600 nm; and a grain density ranging from about $10^7$ grains/cm$^2$ to about $10^9$ grains/cm$^2$.

The present disclosure also provides an embodiment of a LED structure. The LED structure includes a p-type doped gallium nitride (p-GaN) layer on a substrate; a n-type doped gallium nitride (n-GaN) layer approximate the p-GaN layer; and a multiple quantum well (MQW) structure disposed between the n-GaN layer and the p-GaN layer; and a gallium nitride (GaN) buffer layer on the n-GaN layer, wherein the GaN buffer layer includes a rough surface with randomly distributed dips.

In one example of the LED structure, the nano-sized dips have diameters distributed between about 100 nm and about 600 nm. In another example, the nano-sized dips have a dip density ranging from about $10^7$ grains/cm$^2$ to about $10^9$ grains/cm$^2$. In yet another example, the nano-sized dips are spaced from each other with an average spacing S and an average diameter D, and a ratio S/D ranges between about 1.1 and about 1.5. The substrate may include one of a silicon wafer and a metal plate. The LED structure may further include a high reflective metal film disposed between the substrate and the p-GaN layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a nano-mask layer on a first substrate, wherein the nano-mask layer has a randomly arranged grain pattern;
    growing a first epitaxy semiconductor layer in the first substrate, forming a nano-composite layer;
    growing a number of epitaxy semiconductor layers over the nano-composite layer;
    bonding a second substrate to the epitaxy semiconductor layers from a first side of the epitaxy semiconductor layers;
    applying a radiation energy to the nano-composite layer; and
    separating the first substrate from the epitaxy semiconductor layers from a second side of the epitaxy semiconductor layers.

2. The method of claim 1, wherein the forming of the nano-mask layer includes:
    forming a material layer on the first substrate; and
    performing a thermal treatment to the material layer.

3. The method of claim 1, wherein the forming of the nano-mask layer includes:

forming a thin metal film on the first substrate; and
    annealing the thin metal film such that the thin metal film is liquidized and forms nano-sized grains under surface tension.

4. The method of claim 3, wherein the thin metal film includes at least one of nickel and silver.

5. The method of claim 1, wherein the forming of the nano-mask layer includes:
    coating a polymeric solution containing nano-sized particles on the first substrate; and
    curing the polymeric solution to form the nano-mask layer having the randomly arranged grains on the first substrate.

6. The method of claim 5, wherein the nano-mask layer includes one of polyimide and poly(methyl methacrylate).

7. The method of claim 1, wherein the forming of the nano-mask layer includes:
    coating a liquid precursor containing nano-sized particles on the first substrate; and
    performing a thermal treatment to remove solvent from the liquid precursor and form the nano-mask layer of a dielectric material on the first substrate.

8. The method of claim 7, wherein the dielectric material includes at least one of aluminum oxide and aluminum nitride.

9. The method of claim 1, wherein the first substrate includes sapphire and the second substrate includes one of a silicon wafer and a metal plate.

10. The method of claim 1, further comprising forming a dielectric material layer on the first substrate and the forming of the nano-mask layer includes forming the nano-mask layer on the dielectric material layer.

11. The method of claim 10, further comprising etching the dielectric material layer using the nano-mask layer as an etch mask prior to the growing of a first epitaxy semiconductor layer, thereby forming openings in the dielectric material layer, wherein the growing of the first epitaxy semiconductor layer includes growing the first epitaxy semiconductor layer within the openings of the dielectric material layer.

12. The method of claim 11, wherein the etching of the dielectric material layer includes implementing a reactive ion etch (RIE) process.

13. The method of claim 1, wherein:
    the first epitaxy semiconductor layer includes an un-doped gallium nitride (GaN) layer; and
    the number of epitaxy semiconductor layers include a n-type doped gallium nitride (n-GaN) layer and a p-type doped gallium nitride (p-GaN) layer.

14. The method of claim 13, wherein the number of epitaxy semiconductor layers further include a multiple quantum well (MQW) structure disposed between the n-GaN layer and the p-GaN layer.

15. The method of claim 14, wherein the separating of the first substrate from the epitaxy semiconductor layers includes applying a mechanical force to break the nano-composite layer from the first substrate.

16. The method of claim 14, further comprising, after the separating the first substrate from the epitaxy semiconductor layers, performing an etching process to the epitaxy semiconductor layers, generating a rough surface of the epitaxy semiconductor layers.

17. A method comprising:
    forming a dielectric material layer on a sapphire substrate;
    forming a nano-mask layer on the dielectric material layer, wherein the nano-mask layer includes nano-sized grains randomly distributed on the dielectric material layer;
    performing a first etching process to remove the dielectric material layer uncovered by the nano-mask layer, forming nano-rods each including a dielectric feature from the dielectric material layer and one of the nano-sized grains overlying the dielectric feature;

growing a first epitaxy semiconductor layer on the sapphire substrate within gaps of the nano-rods, forming a nano-composite layer having the first epitaxy semiconductor layer and the nano-rods embedded in the first epitaxy semiconductor layer;

growing epitaxy semiconductor layers on the nano-composite layer;

bonding another substrate to the epitaxy semiconductor layers;

applying a radiation energy to the nano-composite layer;

applying a mechanical force to the nano-rods to separate the sapphire substrate from the epitaxy semiconductor layers; and performing a second etching process to the epitaxy semiconductor layers, resulting in a rough surface of the epitaxy semiconductor layers.

18. The method of claim 17, wherein the applying of the radiation energy includes applying a laser power to the nano-composite layer.

19. The method of claim 17, wherein the forming of the nano-mask layer includes:

forming a material layer on the dielectric material layer; and performing a thermal treatment to the material layer to form the nano-mask layer.

20. The method of claim 17, wherein the nano-sized grains have:

diameters distributed between about 100 nm and about 600 nm; and a grain density ranging from about $10^7$ grains/cm$^2$ to about $10^9$ grains/cm$^2$.

* * * * *